United States Patent
Lewis et al.

(10) Patent No.: US 8,896,346 B1
(45) Date of Patent: *Nov. 25, 2014

(54) SELF-MODIFYING FPGA FOR ANTI-TAMPER APPLICATIONS

(75) Inventors: James M. Lewis, Decatur, AL (US);
Joey R. Haddock, Decatur, AL (US);
Dane R. Walther, Madison, AL (US)

(73) Assignee: Lewis Innovative Technologies, Moulton, AL (US)

( * ) Notice: Subject to any disclaimer, the term of this patent is extended or adjusted under 35 U.S.C. 154(b) by 208 days.

This patent is subject to a terminal disclaimer.

(21) Appl. No.: 13/421,052

(22) Filed: Mar. 15, 2012

Related U.S. Application Data

(63) Continuation-in-part of application No. 11/882,803, filed on Aug. 6, 2007, now Pat. No. 8,159,259.

(51) Int. Cl.
*H03K 19/177* (2006.01)

(52) U.S. Cl.
USPC .......................................................... 326/41

(58) Field of Classification Search
CPC ... G06F 21/74; G06F 12/1492; G06F 9/4812; G06F 12/145; G06F 21/71
USPC ............ 326/8, 37–41, 47, 101; 713/193–194; 711/163–164
See application file for complete search history.

(56) References Cited

U.S. PATENT DOCUMENTS

| | | |
|---|---|---|
| 5,452,355 A | 9/1995 | Coli |
| 5,572,696 A | 11/1996 | Sonobe |
| 5,758,121 A | 5/1998 | Fukuzumi |
| 5,898,776 A | 4/1999 | Apland et al. |
| 6,292,898 B1 | 9/2001 | Sutherland |
| 6,356,637 B1 | 3/2002 | Garnett |
| 6,981,153 B1 | 12/2005 | Pang et al. |
| 7,020,019 B2 | 3/2006 | Salessi et al. |
| 7,058,117 B1 | 6/2006 | Iancu et al. |
| 7,117,373 B1 | 10/2006 | Trimberger et al. |
| 7,200,759 B2 | 4/2007 | Oerlemans |
| 7,203,842 B2 | 4/2007 | Kean |
| 7,240,218 B2 | 7/2007 | Kean |
| 7,368,935 B2 * | 5/2008 | Bernier et al. ................... 326/8 |
| 7,759,968 B1 | 7/2010 | Hussein et al. |
| 7,878,902 B2 | 2/2011 | Mattice et al. |
| 2001/0015919 A1 | 8/2001 | Kean |
| 2006/0059574 A1 | 3/2006 | Fayad et al. |
| 2006/0225142 A1 | 10/2006 | Moon |
| 2007/0288765 A1 | 12/2007 | Kean |
| 2010/0023538 A1 | 1/2010 | Kreiner et al. |
| 2010/0232600 A1 | 9/2010 | Lewis |

* cited by examiner

*Primary Examiner* — Thienvu Tran

(74) *Attorney, Agent, or Firm* — Welsh Flaxman & Gitler LLC

(57) ABSTRACT

A self-modifying FPGA system includes an FPGA and a configuration memory coupled to the FPGA for providing the FPGA with configuration data including SAFE configuration data and dormant configuration data. The SAFE configuration data is initially loaded to the FPGA and the FPGA is configured to a safe operating mode. Upon a determination to proceed to a next step of self modification, dormant configuration data contained in the configuration memory is loaded into the FPGA and the FPGA is configured to a secure operating mode.

7 Claims, 13 Drawing Sheets

FPGA System for Self-Modification showing Configuration Memory Detail B, a system with Configuration Data and Dormant Data.

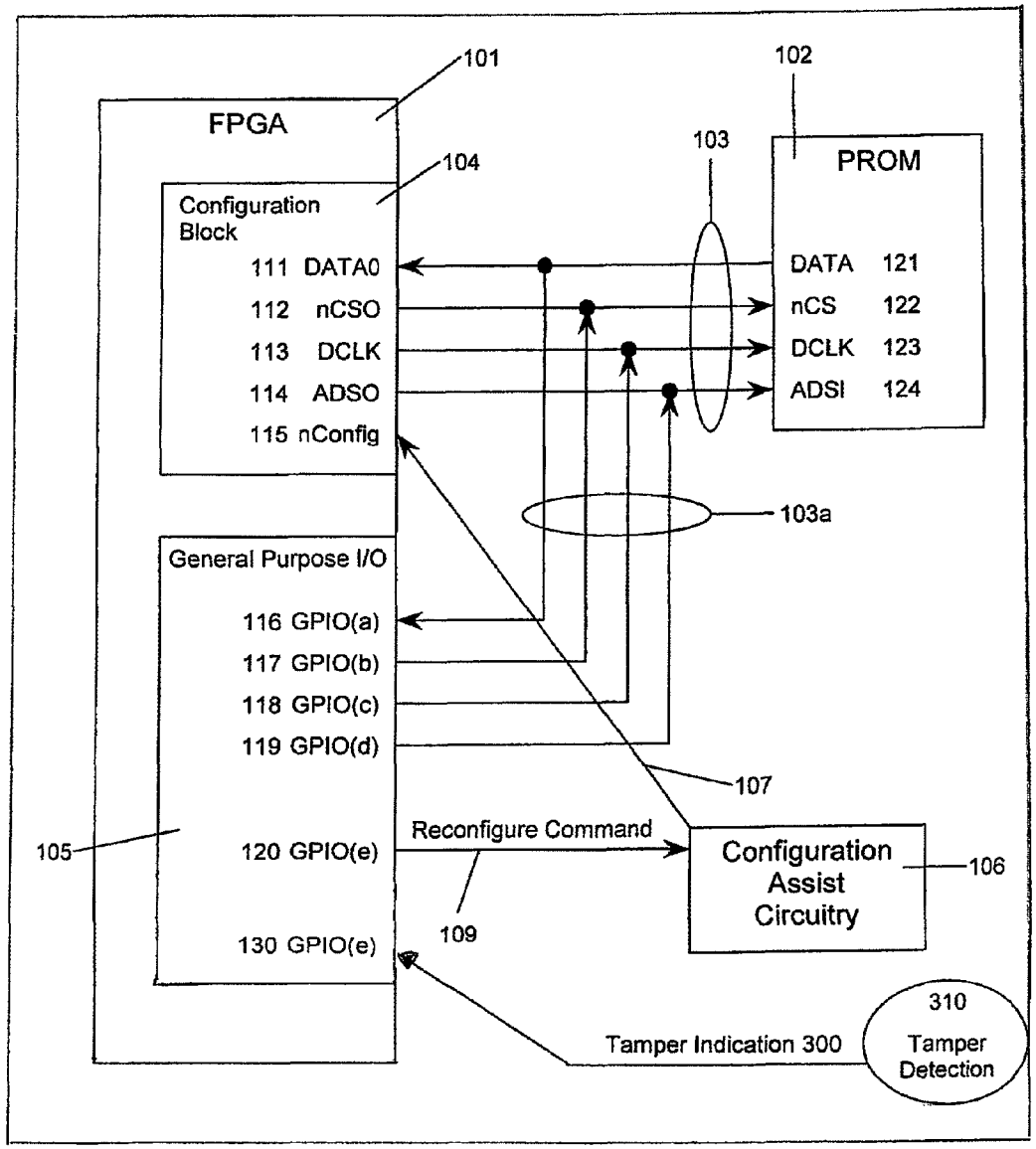
Figure 1, Block Diagram of FPGA System for Self-Modification

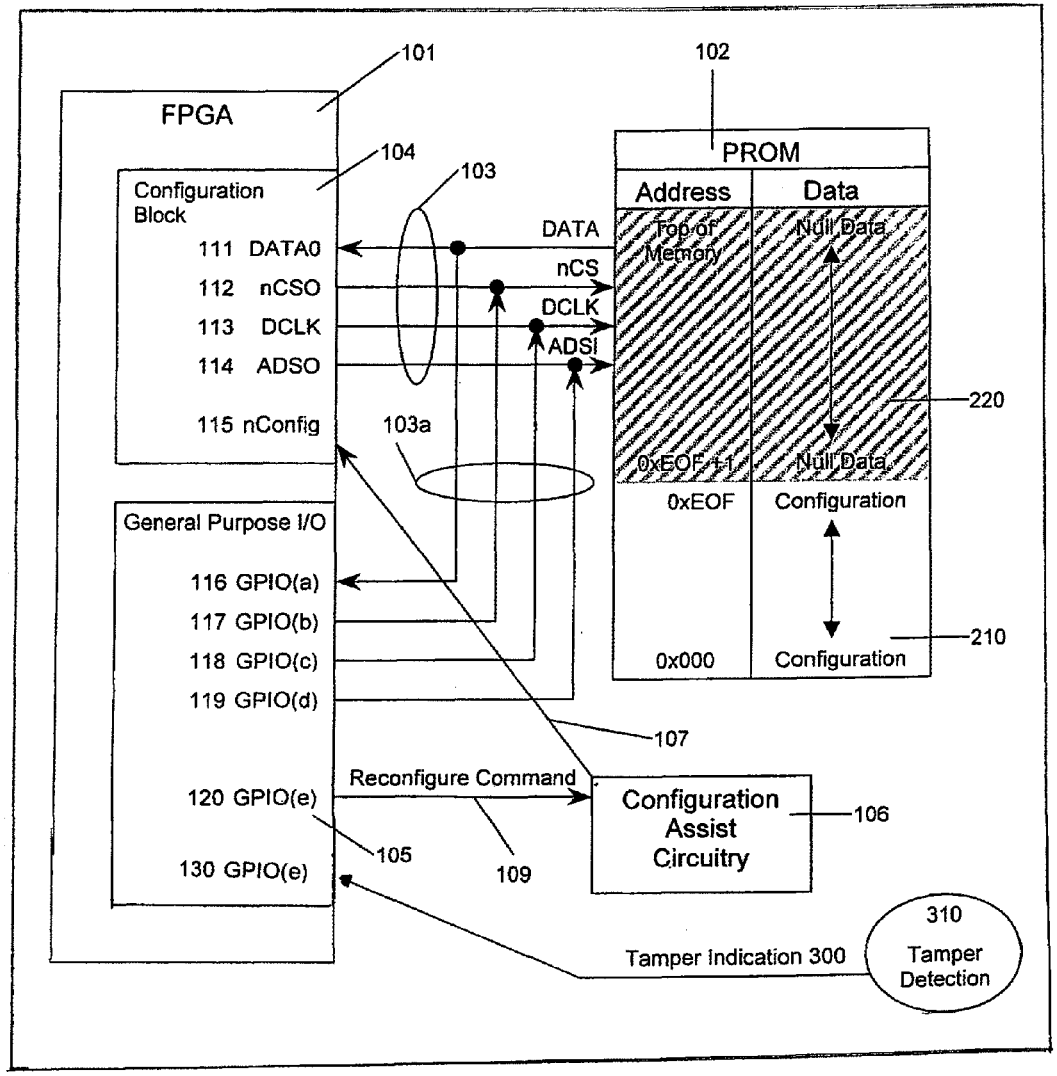
Figure 2, FPGA System for Self-Modification showing Configuration Memory Detail A, a system with Configuration Data and Null Data.

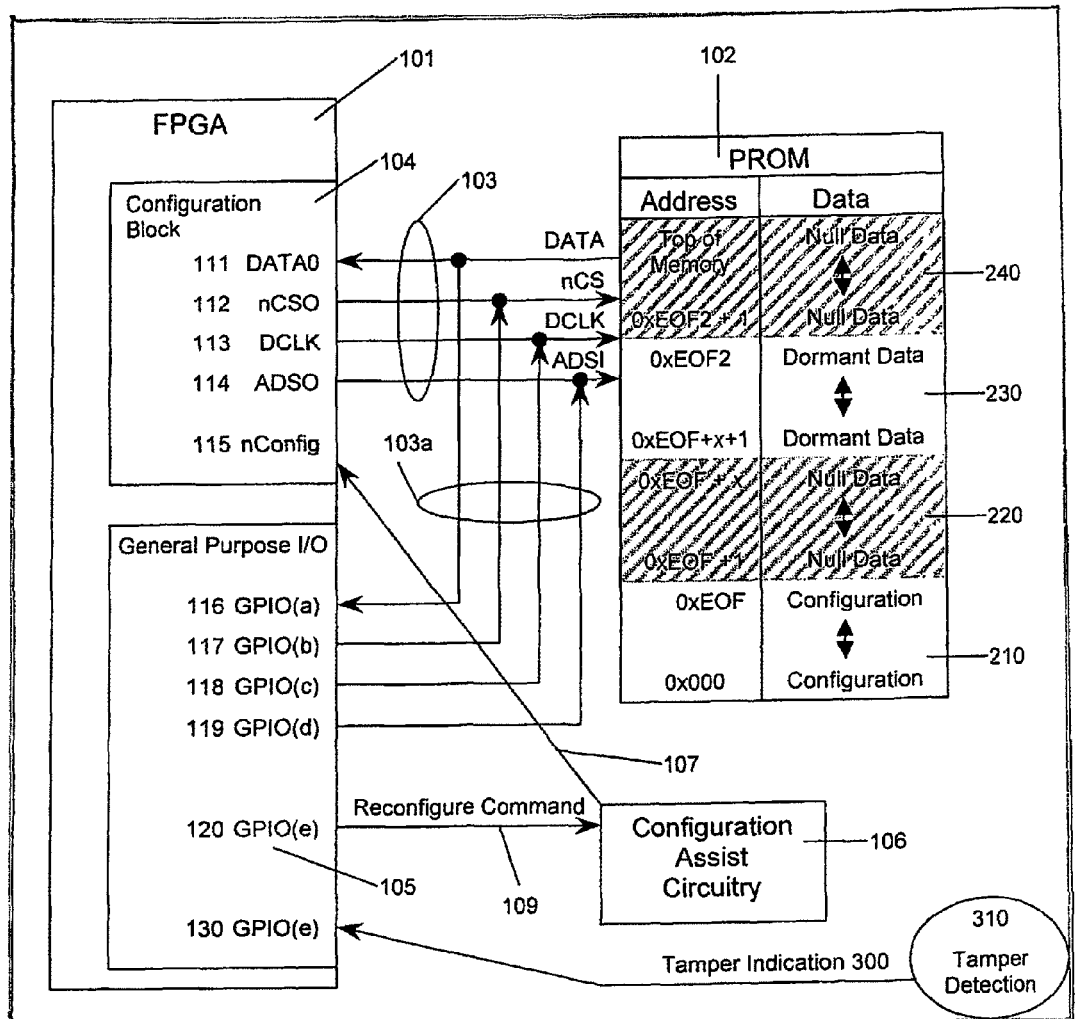
Figure 3, FPGA System for Self-Modification showing Configuration Memory Detail B, a system with Configuration Data and Dormant Data.

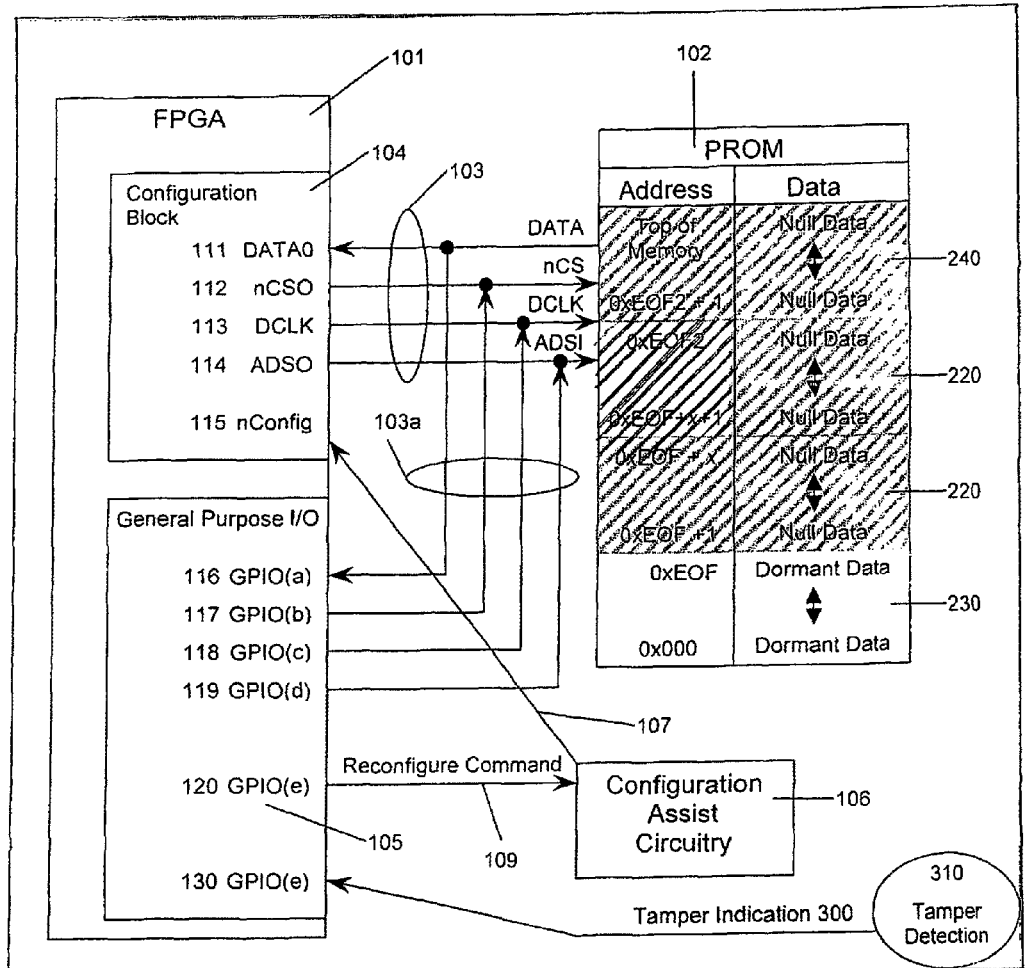
Figure 3A, FPGA System for Self-Modification showing Configuration Memory Detail B after a tamper indication and self-modification.

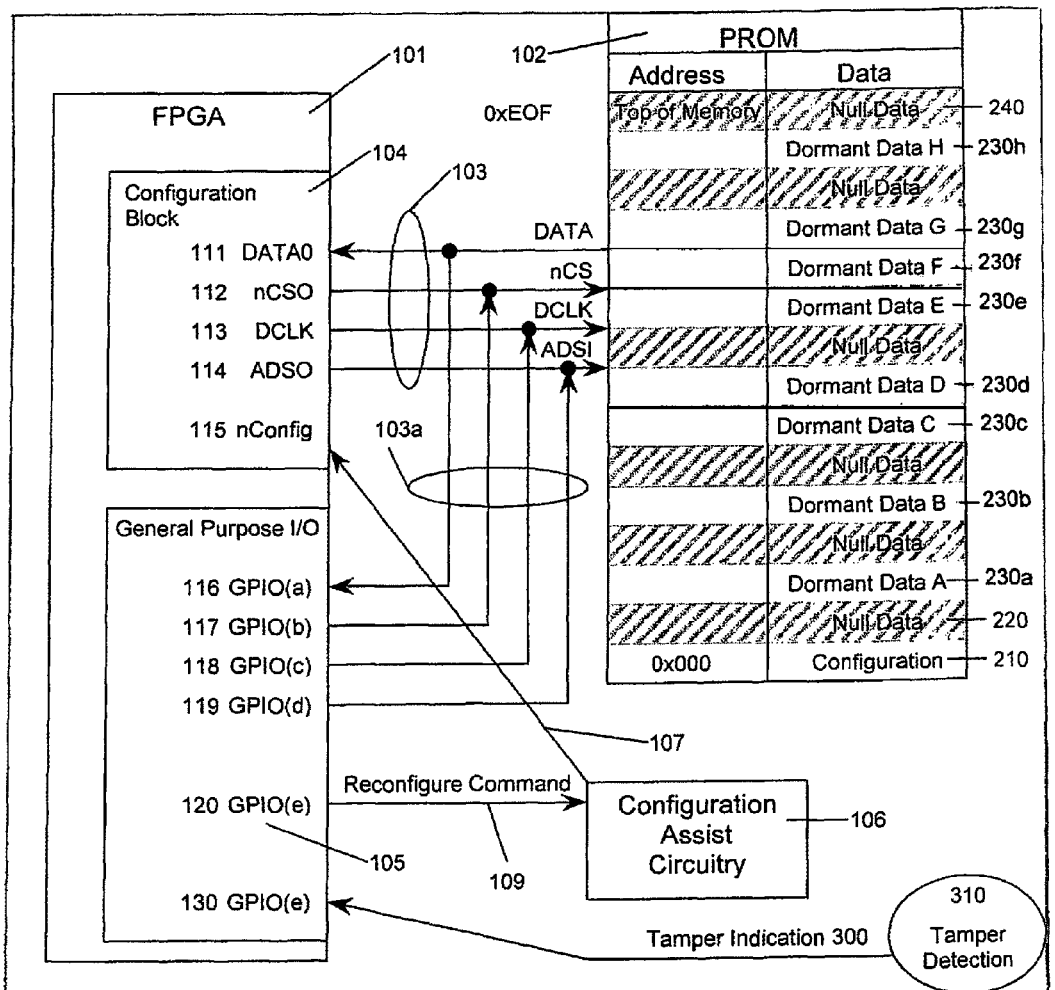
Figure 4, FPGA System for Self-Modification showing Configuration Memory Detail C, a system with Configuration Data and multiple Dormant Data Sets.

Figure 5, Example PROM Memory Contents

| PROM CONTENTS | | |
|---|---|---|
| Address | Data Contents | |
| Top of Memory | Null Data | 615 |
| | Dormant Data D | 614 |
| | Null Data | 613 |
| | Dormant Data G | 612 |
| | Dormant Data F | 611 |
| | Dormant Data E | 610 |
| | Null Data | 609 |
| | Dormant Data H | 608 |
| | Dormant Data B | 607 |
| | Null Data | 606 |
| | Dormant Data C | 605 |
| | Null Data | 604 |
| | Dormant Data A | 603 |
| | Null Data | 602 |
| 0x0000 | SAFE Configuration Data | 601 |

600

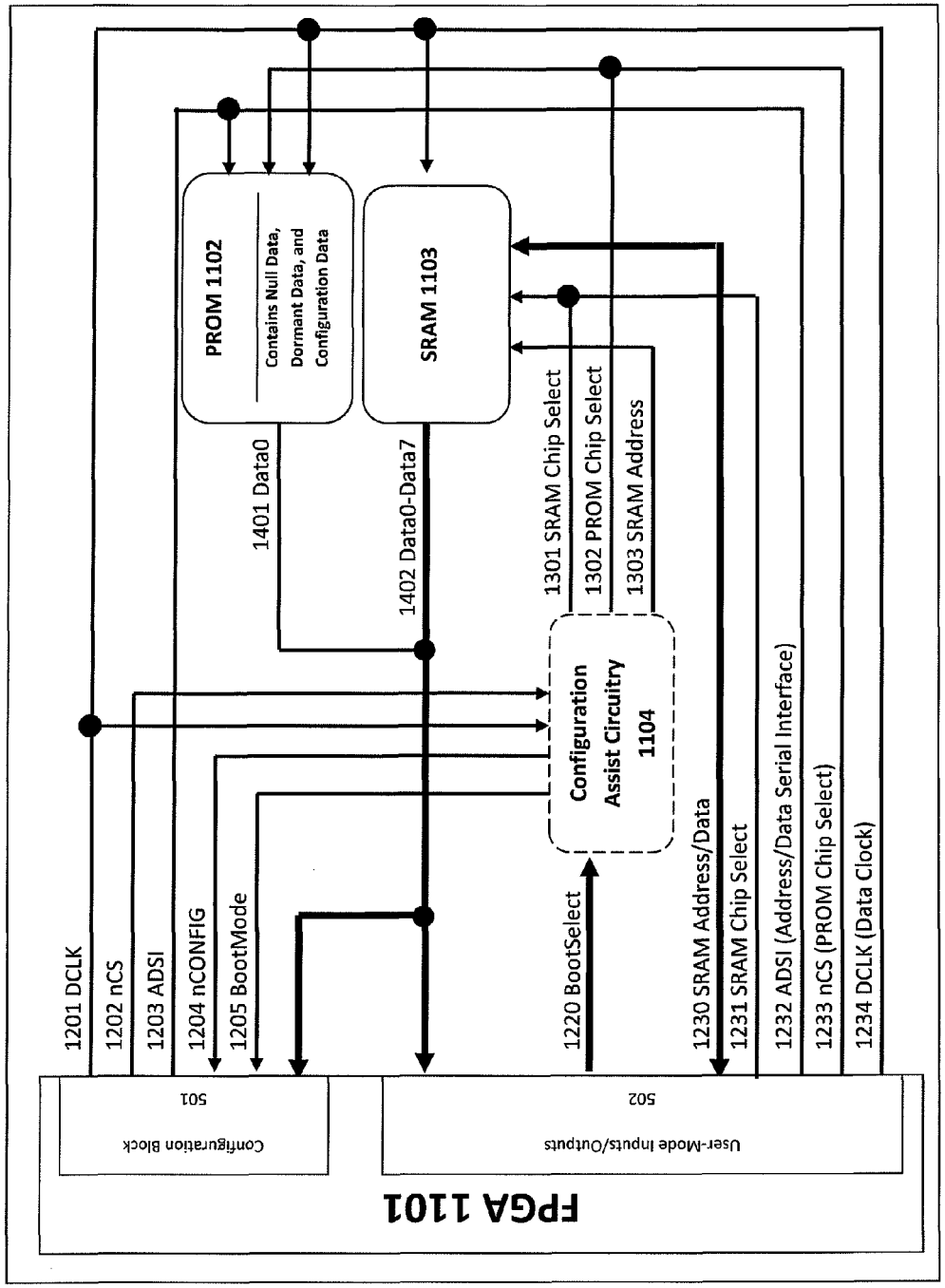
Figure 6, Overview of Signals Used for FPGA Configuration from Serial-PROM and Parallel-SRAM

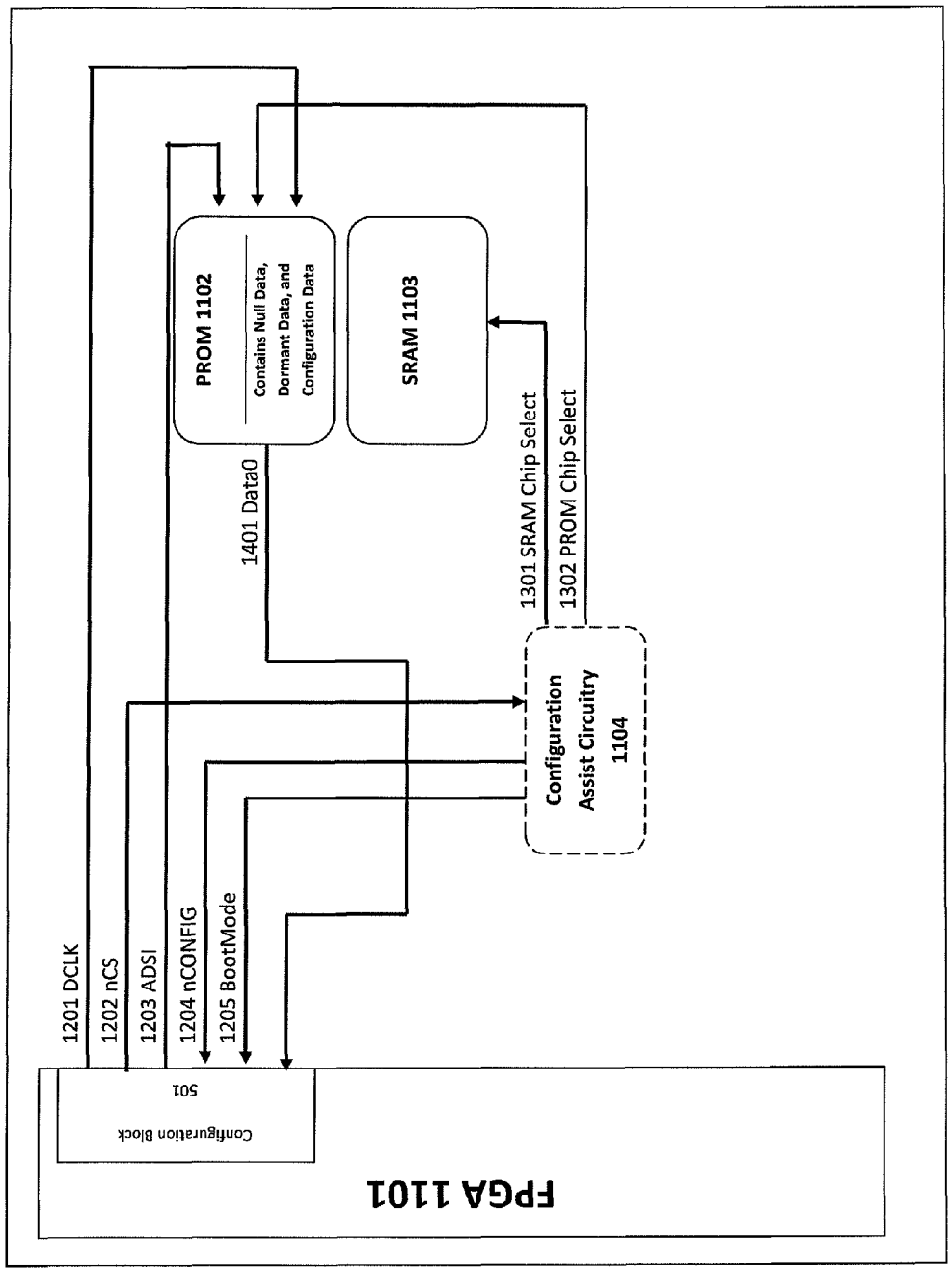
Figure 7, Active Signals for FPGA Configuration from Serial PROM

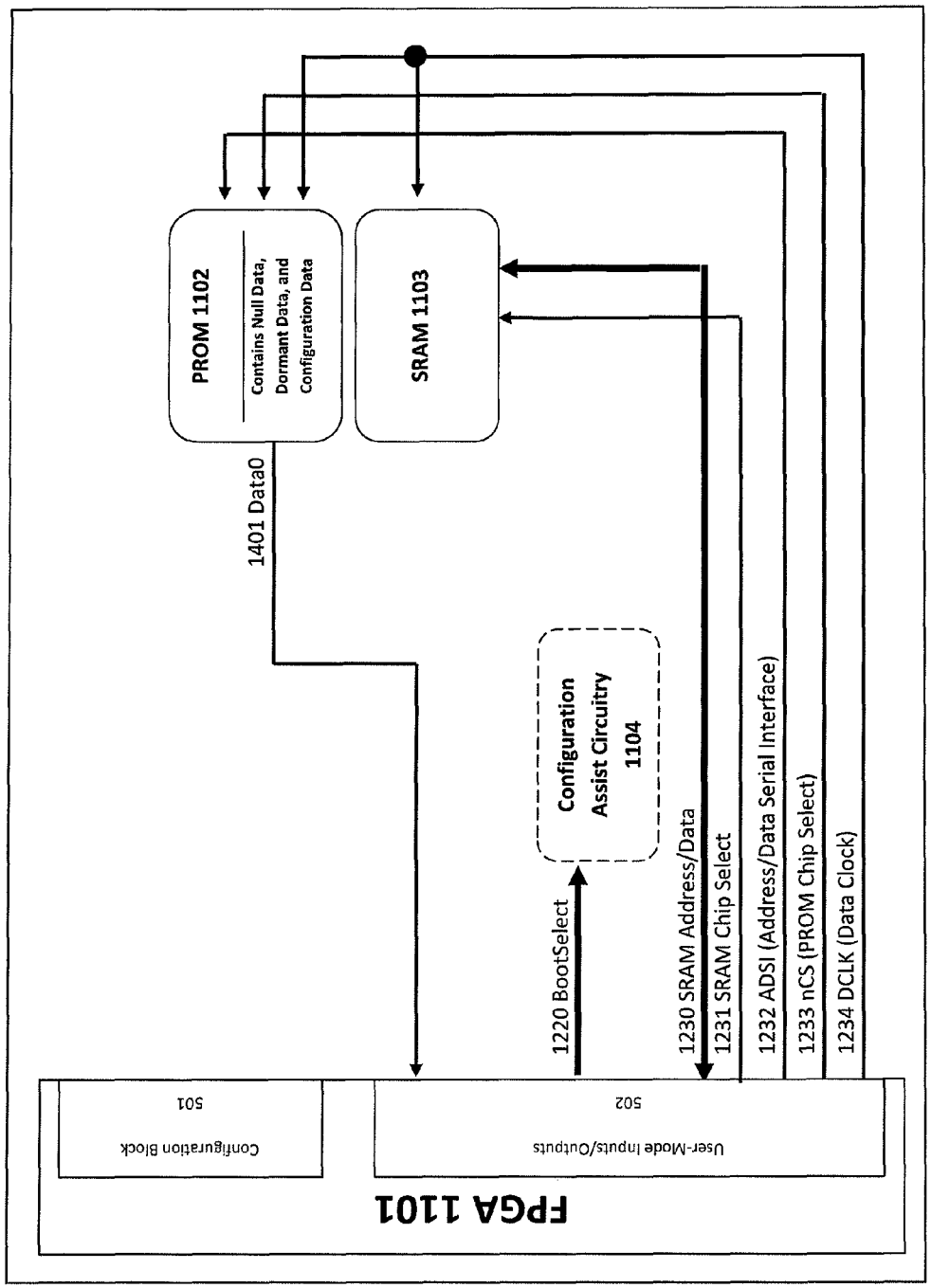
Figure 8, Active Signals for Moving Configuration Data from PROM into SRAM

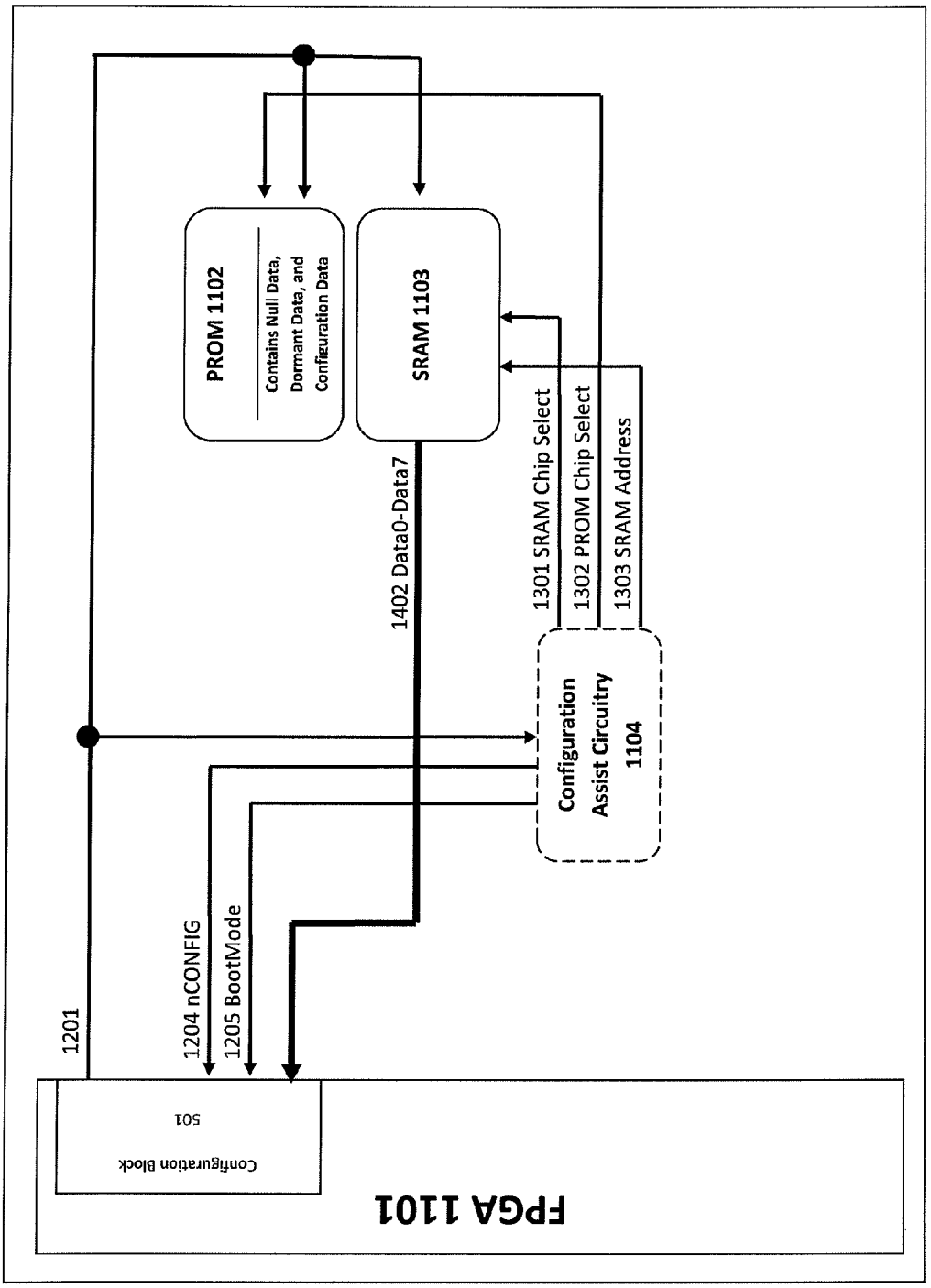
Figure 9, Active Signals for FPGA Configuration from Parallel SRAM

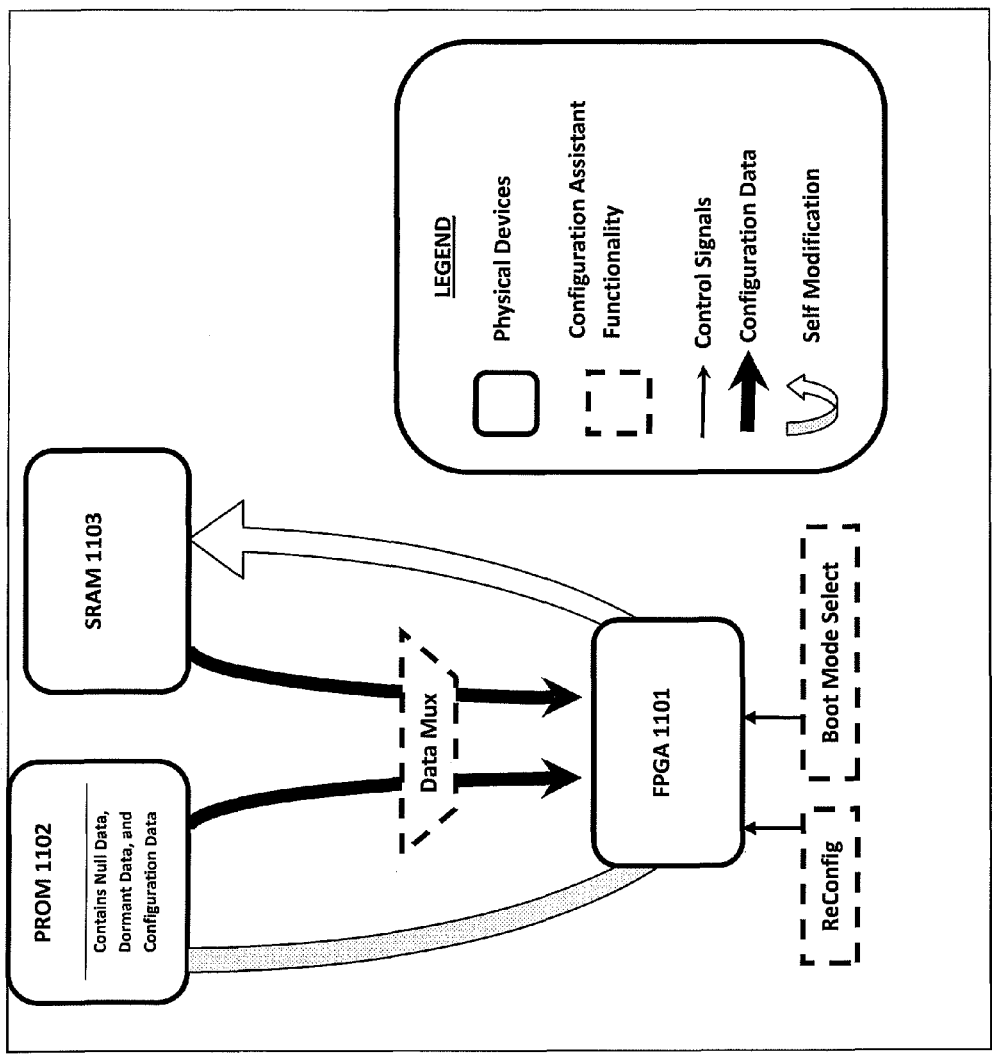
Figure 10, Example Data Flow Sequence

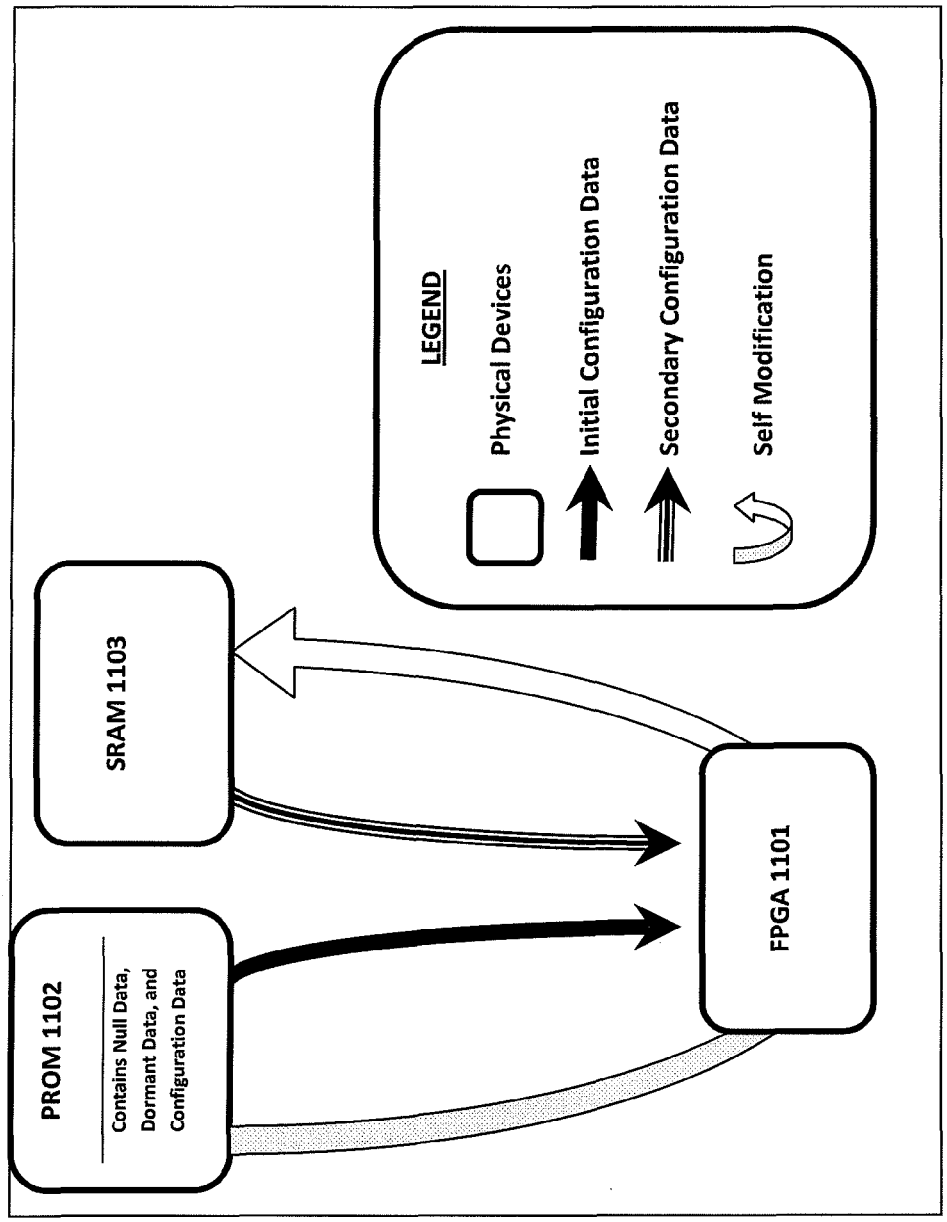
Figure 11, Example Data Flow Sequence

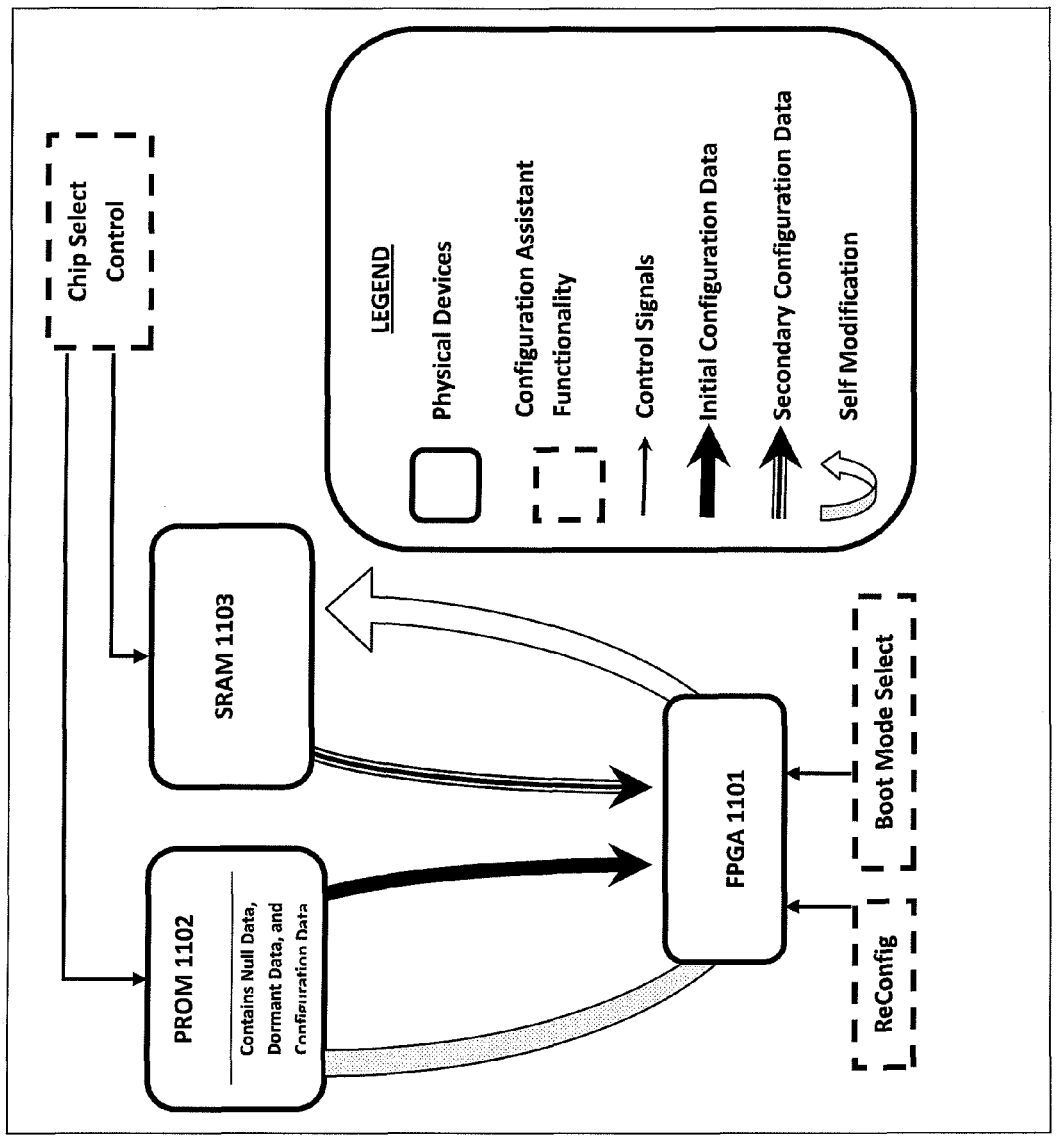
Figure 12, Example Data Flow Sequence

SELF-MODIFYING FPGA FOR ANTI-TAMPER APPLICATIONS

CROSS REFERENCE TO RELATED APPLICATION

This application is a continuation-in-part of U.S. patent application Ser. No. 11/882, 803, entitled "SELF-MODIFYING FPGA FOR ANTI-TAMPER APPLICATIONS," filed Aug. 6, 2007 now U.S. Pat. No. 8,159,259.

The U.S. Government has a paid-up license in this invention and the right in limited circumstances to require the patent owner to license others on reasonable terms as provided by the terms of contract number N 00178-06-C-3032 awarded by the Department of Defense.

BACKGROUND OF THE INVENTION

1. Field of the Invention

The present invention relates to a system for preventing tampering of electronic devices. More particularly, the invention relates to a self-modifying FPGA (field programmable gate array) for anti-tamper applications.

2. Description of the Related Art

Many electronic systems are computer based. That is, these electronic systems are connected to a host computer or include a computer (in the form of a microprocessor or microcontroller) as a system controller. In these computer based systems, the computer can be programmed to take care of sanitizing memory devices if required.

Some electronic systems do not include a computer or processor. Other electronic systems may include memory in subsystems that is not accessible by processors or computer resources for the purpose of sanitizing. Often, these memories are associated with ASICs (Application Specific Integrated Circuits) or FPGAs (Field Programmable Gate Arrays). These memories may be used as processing memory to hold data that is undergoing mathematical manipulation or other processing by the FPGA or ASIC, or these memory devices may be PROMs that store configuration data for the ASIC or FPGA. The present invention deals primarily with the latter case; that is, non-volatile memories (PROMs) that contain configuration data for ASICs or FPGAs.

As those skilled in the art are well aware, FPGAs are integrated circuit devices that can be programmed in the field after manufacture. FPGAs are similar to, but have wider applications than, PROM chips. FPGAs are commonly used by engineers in the design of specialized integrated circuits that can later be produced hard-wired in large quantities for distribution to computer manufacturers and end users.

Electronic systems and sub-systems that are FPGA based are becoming more common. Image and audio processing are greatly accelerated by using FPGA resources for Digital Signal Processing, compared to using a microprocessor. FPGAs can process large arrays of data in parallel and specialized functions such as Fast Fourier Transforms (FFT), digital filtering, and image compression can be performed with orders of magnitude speed improvements over processors.

FPGAs are attractive design options because their functionality can be modified, upgraded, or completely changed, hence, the "field programmable" portion of their name. Each time an SRAM (static random access memory) FPGA is powered, the FPGA reads configuration information from an accompanying memory device (for example, the PROM). This configuration information is used to specify the operation of the digital gates, flip-flops, memory structures, routing resources, and other internal components of the FPGA. The configuration data stored in the PROM is, therefore, a binary representation of the design of the FPGA hardware.

If the configuration data is copied from a PROM and written into another PROM, the entire FPGA design has been transferred or replicated. In many electronic systems it is desirable to prevent this copying or replication. An electronic system may be of a classified nature and the Government desires to keep the details of the design secret. In non-government applications the commercial electronics design may represent Intellectual Property and significant investment. Compromise or copying of this commercial design would result in loss of profits and failure to recoup research and investment costs. Because of examples like these, it is desirable to provide for systems preventing tampering with secure information.

This present invention provides a system to prevent tampering with secure information in electronic systems.

SUMMARY OF THE INVENTION

It is, therefore, an object of the present invention to provide a self-modifying FPGA system including an FPGA and a configuration memory coupled to the FPGA for providing the FPGA with configuration data including SAFE configuration data and dormant configuration data. The SAFE configuration data is initially loaded to the FPGA and the FPGA is configured to a safe operating mode. Upon a determination to proceed to a next step of self modification, dormant configuration data contained in the configuration memory is loaded into the FPGA and the FPGA is configured to a secure operating mode.

It is also an object of the present invention to provide a self-modifying FPGA system wherein the configuration memory includes a PROM and SRAM.

It is another object of the present invention to provide a self-modifying FPGA system wherein the PROM stores the SAFE configuration data and the dormant configuration data.

It is a further object of the present invention to provide a self-modifying FPGA system wherein the SRAM provides for the volatile storage of the dormant configuration data.

It is also an object of the present invention to provide a self-modifying FPGA system wherein the FPGA is capable of receiving configuration data from either the PROM or the SRAM.

It is another object of the present invention to provide a self-modifying FPGA system including configuration assist circuitry coupled to the FPGA, the PROM and the SRAM for controlling loading of configuration information from the PROM and the SRAM to the FPGA.

It is a further object of the present invention to provide a self-modifying FPGA system wherein the SAFE configuration data functions to sanitize the contents of the SRAM.

It is also an object of the present invention to provide a self-modifying FPGA system wherein the SAFE configuration data includes user mode logic functionality to read data from the PROM and write data to the SRAM appropriately to transfer dormant configuration data contained within the PROM to the SRAM.

It is another object of the present invention to provide a self-modifying FPGA system including configuration assist circuitry coupled to the FPGA and the configuration memory device for controlling loading of configuration information from the configuration memory device to the FPGA.

It is a further object of the present invention to provide a method for implementing a self-modifying FPGA system including a FPGA, a PROM and a SRAM. The method includes programming the PROM with both SAFE configuration data and dormant configuration data; upon application of power to the FPGA system, loading SAFE configuration data into the FPGA and thereby placing the FPGA into a safe operating mode; loading dormant configuration data from the PROM onto the SRAM, wherein the loaded dormant configuration data becomes secure configuration data once loaded onto the SRAM; and loading onto the FPGA the secure configuration data on the SRAM and thereby placing the FPGA is secure operating mode.

It is also an object of the present invention to provide a method for implementing a self-modifying FPGA system wherein the FPGA system further includes a configuration assist circuitry and the configuration assist circuitry establishes a configuration mode for the FPGA and determines whether SAFE configuration data or dormant configuration data is to be loaded onto the FPGA.

It is another object of the present invention to provide a method for implementing a self-modifying FPGA system wherein after configuration of the FPGA into the safe operating mode, the SRAM is sanitized.

It is a further object of the present invention to provide a method for implementing a self-modifying FPGA system wherein after loading the secure configuration data onto the FPGA from the SRAM, the system is switched to back to safe operating mode in the event of system shutdown or power cycling or unauthorized access and/or tampering of the system.

It is also an object of the present invention to provide a method for implementing a self-modifying FPGA system wherein after loading the secure configuration data onto the FPGA from the SRAM, the SRAM is sanitized to remove from the SRAM any trace of configuration data that was loaded into the FPGA.

It is another object of the present invention to provide a method for implementing a self-modifying FPGA system wherein after configuration of the FPGA into the safe operating mode, the SRAM is sanitized.

Other objects and advantages of the present invention will become apparent from the following detailed description when viewed in conjunction with the accompanying drawings, which set forth certain embodiments of the invention.

BRIEF DESCRIPTION OF THE DRAWINGS

FIG. 1 is a block diagram of a first embodiment of an FPGA system for self-modification in accordance with the present invention.

FIG. 2 is a block diagram of the first embodiment of the FPGA system disclosed with reference to FIG. 1, prior to a tamper indication and self modification, in accordance with the present invention showing configuration memory detail A, that is, an FPGA system with configuration data and null data (and the dormant data not shown).

FIG. 3 is a block diagram of the first embodiment of the FPGA system disclosed with reference to FIG. 1, prior to a tamper indication and self-modification, in accordance with the present invention showing configuration memory detail B, that is, an FPGA system with configuration data and dormant data.

FIG. 3A is a block diagram of the first embodiment of the FPGA system disclosed with reference to FIG. 1 showing configuration memory detail B after a tamper indication and a self-modification.

FIG. 4 is a block diagram of the first embodiment of the FPGA system disclosed with reference to FIG. 1, prior to a tamper indication and self-modification, in accordance with the present invention showing configuration memory detail A, that is, an FPGA system with configuration data and multiple dormant data sets.

FIG. 5 is a schematic of exemplary PROM contents in accordance with a second embodiment of the FPGA system disclosed with reference to FIGS. 6 through 12.

FIG. 6 is a schematic showing FPGA configuration based upon a serial PROM and a parallel SRAM in accordance with the second embodiment of the FPGA system.

FIG. 7 is a schematic showing FPGA configuration from the serial PROM in accordance with the second embodiment disclosed in FIG. 6.

FIG. 8 is a schematic showing active signals moving configuration data from the PROM and the SRAM in accordance with the second embodiment disclosed in FIG. 6.

FIG. 9 is a schematic showing FPGA configuration from the parallel SRAM in accordance with the second embodiment disclosed in FIG. 6.

FIGS. 10 through 12 show various steps in the data flow sequence associated with the embodiment disclosed with reference to FIGS. 5-9.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

As will be appreciated based upon the following disclosure, the present FPGA system is implemented using FPGAs and PROMs manufactured by Altera Corporation of San Jose, Calif., as well as an industry standard SRAM from Cypress Semiconductor Corporation also of San Jose, Calif. Although all of these devices are employed in accordance with a preferred embodiment of the present invention, it is appreciated that the concepts of the present invention are applicable to any electronic system using SRAM based FPGAs and particularly SRAM based FPGAs with both non-volatile configuration memory devices (PROM, EEPROM, FLASH Memory, or other) and volatile memory devices such as an SRAM.

Referring to FIGS. 1, 2, 3 and 4 a first embodiment of an FPGA system 100 in accordance with the present invention is shown in various configurations. The various configurations are substantially identical with the exception of the utilization of the dormant data 230, configuration data 210 and/or null data 220 within the configuration memory device 102. In general, the FPGA system 100 includes an FPGA 101, and a configuration memory device 102 coupled to the FPGA 101 for providing the FPGA 101 with configuration information, wherein the configuration memory device 102 is programmed with configuration data 210, dormant data 230 and/or null data 220. The FPGA system also includes a configuration assist circuit 106 coupled to the FPGA 101 and the configuration memory device 102 for controlling loading of configuration information from the configuration memory device 102 to the FPGA 101. A tamper detection system 310 is further provided. The tamper detection system 310 provides a tamper indication signal 300 to the FPGA 101, wherein when a tamper indication signal is received by the FPGA 101 the configuration data 210 is replaced with the dormant data 230.

The present first embodiment provides for the implementation of anti-tamper, self-modifying electronic systems employing a self-modifying FPGA 101 for various applications requiring anti-tamper capabilities. The first embodiment also provides a mechanism for sanitizing an FPGA and FPGA configuration devices by providing a self-modification feature removing sensitive information in the event of tampering. The first embodiment also provides a mechanism for combating (or hindering) reverse engineering in FPGAs and a mechanism for protecting critical design information in FPGA applications.

These goals are achieved by providing the present FPGA system 100 to automatically sanitize an FPGA 101 and configuration memory device (for example, a PROM) 102 when an unauthorized access, tampering, or compromise is detected or indicated by some input (or indicated by a signal from a tamper detection system). The present FPGA system 100 sanitizes the configuration memory device 102 (that is, PROM) quickly and thoroughly without leaving evidence of the sanitation. The sanitation process is further enhanced by the capability of the present FPGA system 100 to write new configuration information into the configuration memory device 102 so that the FPGA 101 exhibits functionality other than the originally intended purpose. This new configuration information serves to mislead the person attempting to tamper with the FPGA 101 by implying that the post-sanitation design represents the complete functionality of the electronic device or system.

In accordance with a preferred first embodiment of the present invention, the present FPGA system 100 described herein is implemented using FPGAs manufactured by Altera Corporation of San Jose, Calif. Although FPGAs from Altera Corporation are employed in accordance with a preferred embodiment of the present invention, those skilled in the art will appreciate the concepts of the present invention are applicable to any electronic system using SRAM based FPGAs and particularly SRAM based FPGAs with non-volatile configuration memory devices (PROM, EEPROM, FLASH Memory, or other).

In accordance with a preferred embodiment the FPGA 101 is a SRAM based FPGA. The SRAM based FPGA is a Programmable Logic Device (PLD) that utilizes SRAM cells to hold configuration information. This configuration information (that is, and as will be discussed below in greater detail the original configuration data 210 used for proper operation of the electronic system or the dormant data 230 used in the event of a tamper indication signal so as to trick the unauthorized user into believing no modification of the FPGA system has taken place) determines the operation of every component of the FPGA: logic cells, sequential logic devices (flip flops), memory arrays, routing resources that connect the various functional units, and Input/Output (I/O) features such as drive capacity, interface specifications (CMOS (complementary metal-oxide semiconductor), TTL (transistor-transistor logic), LVDS (low voltage data signal), LVPECL (low voltage positive emitter coupled logic), and others), data direction (input, output, bidirectional).

These SRAM data bits are volatile, that is, they lose the data when the device loses power. When the FPGA 101 is powered without configuration data, it is a useless device. Therefore, the SRAM based FPGA 101 is usually paired with a non-volatile configuration memory device 102 (for example, PROM, EEPROM, FLASH, or other). When the FPGA 101 is powered, dedicated circuitry loads the configuration data from the configuration memory device 102 causing the FPGA 101 to become a useful device.

The FPGA may be configured by serial or parallel data and may be connected to either serial or parallel configuration memory devices. In accordance with a preferred embodiment, the FPGA 101 is configured using serial configuration devices. However, the use of parallel data bus and parallel configuration devices are specifically anticipated and the techniques described in accordance with the implementation of the present FPGA system are identical whether a serial or parallel configuration scheme is used.

In accordance with a preferred embodiment of this first embodiment and with reference to FIG. 1, the present self-modifying FPGA system 100 for anti-tamper applications is comprised of an SRAM based FPGA 101, a FLASH based PROM configuration memory device 102 (EEPROM may also be used), configuration assist circuitry 106, and typical support components such as power supplies and oscillator or clock device (not shown).

In accordance with a preferred embodiment of the FPGA system 100, Data input (DATA0 pin 111 and ADSO pin 114), clock output (DCLK pin 113), and chip select signal output (nCSO pin 112) of the configuration block 104 of the FPGA 101 are respectively connected to Data output (DATA pin 121 and ADSI pin 124), clock input (DCLK pin 123) and chip select input (nCS pin 122) of the configuration memory device (or PROM) 102 by conductors (or configuration data bus) 103. These conductors may be PCB (printed circuit board) traces, wire bonds directly to the silicon dies of the two components, conductors internal to an IC (integrated circuit) if the PROM and FPGA are part of the same piece of silicon, or any other suitable connectivity method. Additional General Purpose I/O pins 116, 117, 118, 119 in the FPGA's General Purpose I/O 105 is also connected to these configuration signals by conductors (or configuration data bus) 103a. As those skilled in the art will certainly appreciate, the FPGA 101 will traditionally include a great deal more GPIO (general purpose input/output) and general purpose circuitry beyond what is used to implement the self-modifying functions of the present invention and such circuitry is not shown herein, although it will be appreciated by those skilled in the art how such circuitry is employed in conjunction with normal operation of the FPGA.

The configuration assist circuitry 106 connects to a general purpose I/O pin 120 of the GPIO 105 and to the FPGA's nConfig pin 115 of the configuration block 104 via respective conductors 109, 107.

In normal operation, the FPGA's configuration block 104 accesses the PROM 102 at power-up. The FPGA 101 supplies the data clock (DCLK pin 113), chip select (nCSO pin 112), and data output (ADSO pin 114) signals to the PROM 102. In response, the PROM, that is, the configuration memory device, 102 provides the configuration information (in the event of a normal operation, the configuration data 210) to the DATA0 pin 111.

This configuration operation (or process) occurs every time the FPGA 101 is powered or whenever the nConfig pin 115 is asserted (that is, pulled low since this is an active low input).

In the case that a self-modification is required, the FPGA 101 uses general purpose I/O pins 116, 117, 118, 119 to rewrite the PROM 102, write new data to the PROM 102, or re-arrange data in the PROM 102. When not in use by the FPGA 101 for configuration, the configuration pins 111, 113, 114 are placed in a high impedance state. Configuration pins nCSO pin 112 and nConfig pin 115 are open collector pins that are pulled high by a resistor (not shown) so that they may be asserted by being pulled low by any attached device.

Once the PROM data has been changed, the FPGA 101 asserts a "reconfigure command" output 109 on General Purpose I/O pin 120 to the configuration assist circuitry 106. Upon receiving the "reconfigure command" signal from the FPGA 101 via conductor 109, the configuration assist circuitry 106 asserts the nConfig pin 115 signal low (on conductor 107) for the appropriate amount of time to force a reload of new data from the PROM 102 to the FPGA 101. This reloading of new configuration information amounts to a reconfiguration of the FPGA 101.

The configuration assist circuitry 106 is required to guarantee that the signal applied to the nConfig pin 115 is held low for the appropriate amount of time to force a reconfiguration. Because of the programmable nature of the FPGA 101, as soon as the nConfig pin 115 is forced low, all of the general purpose I/O pins 115, 116, 117, 118, 119, 120 become high impedance pins unable to drive any signals. The configuration assist circuitry 106 requires only a very brief reconfigure command input 109 and then holds the signal applied to the nConfig pin 115 low for the appropriate amount of time. In accordance with a preferred embodiment, the configuration assist circuitry 106 has been implemented by using digital circuitry, simple Resistor/Capacitor (RC) circuits, and using transistor based circuits. The implementation of this portion of the design may be carried out in any number of ways to ensure that nConfig pin 115 remains low for the appropriate amount of time.

The arrangement and storage of information in the configuration memory device (that is, PROM) 102 is important in the implementation of the present self-modifying FPGA system 100. In accordance with a preferred implementation of the present FPGA system 100 as shown in FIG. 2 the PROM 102 contains configuration data 210 for the FPGA 101 starting at address 0x000 extending to some address sufficient to hold all of the necessary configuration information (0xEOF in this example denotes the address with the last bit of configuration, or End Of File data). The addresses from 0x000 to 0xEOF which contain the configuration information are also referred to as the configuration position, that is, the memory location from which the FPGA 101 reads its configuration information. From the next address (0xEOF+1) to the end of memory (or Top Of Memory) the remaining addresses in the PROM 102 are typically filled with null data 220.

A configuration operation occurs when the FPGA 101 is powered or if the nConfig input 115 is pulled low by the configuration assist circuitry 106, for example, based upon the issuance of a tamper indication signal 300 by the tamper detection system 310 (as discussed below in greater detail). During a configuration operation, the FPGA 101 automatically reads the configuration data 210 (or other configuration information, such as, dormant data 230 as discussed below in greater detail) from the PROM 102 using the configuration data bus 103.

As briefly mentioned above, because of the sizes of PROMs available and also the availability of configuration information compression, the PROMs memory cells are not completely filled with configuration information, but also contain null data 220 to fill out the rest of the configuration memory device 102. This null data 220 may be all logical "1", all logical "0", or some null pattern.

FIG. 2 illustrates normal FPGA configuration data 210 in accordance with the first embodiment (that is, intended configuration information for proper operation and not the dormant data placed in the configuration position upon the occurrence of a tamper indication) in the configuration position (as discussed below in greater detail) and null data 220 prior to a tamper indication signal 300 and self-modification. FIG. 3 depicts the FPGA configuration data 210 in the present anti-tamper FPGA system 100 as designed and configured for tamper protection in accordance with an implementation of the present invention. FIG. 3A shows the present FPGA system 100 after a tamper indication signal 300 and self-modification as discussed herein in greater detail.

As shown in FIG. 3, the configuration memory device, that is, PROM, 102 is configured for anti-tamper, self-modifying applications and contains configuration data 210 located beginning at the zero address (that is, 0x000), that is, the configuration position. There is a second set of configuration information referred to as dormant data 230. The dormant data 230 is actually a valid set of configuration information, but is not located beginning at the zero address (or configuration position) and, therefore, is not loaded by the FPGA 101 during a configuration operation.

In anti-tamper, self-modifying applications in accordance with the operation of the present FPGA system 100, the FPGA 101 includes some input that indicates that a tamper event has occurred (for example, tamper indication signal 300 as provided by a tamper detection system 310). Those skilled in the art will appreciate the various possibilities of operation of the tamper indication signal 300 which may be utilized within the spirit of the present invention. As far as the present invention is concerned, some tamper detection device or system 310 exists to detect that a tamper has occurred or is being attempted.

In accordance with the first embodiment of the present invention, the tamper detection system 310 is preferably a sensor that identifies 1) a change in radiation (indicates the system is being x-rayed); (2) a change in pressure or gaseous content (indicates that an atmospheric seal has been broken); (3) change in a simple switch condition (indicates that an operator has pressed the panic button or that a tamper switch has been triggered). Mercury switches can be used to indicate that a system is being tampered with. More elaborate systems include continuity loops to indicate that a system is still properly assembled or time-based access to indicate that it is the proper time for the device to be used (like the clock control on a bank vault that prohibits the vault being opened before 8:00 AM or after 5:00 PM). In military aircraft, the tamper (or self-destruct) signal is activated when the pilot ejects. In secure computing equipment, the self-destruct is triggered by repeatedly entering an incorrect (invalid) password/user combination.

The tamper detection system 310 provides a tamper indication signal 300 to the FPGA 101 to indicate that a tamper event has occurred or is occurring. This input may be implemented in a number of ways and may indicate numerous types of events. The tamper detection system 310 may even be internal to the FPGA 101. In accordance with a preferred embodiment, most of the tamper detection system 310 is implemented in the FPGA 101.

When the tamper detection system 310 asserts the tamper indication signal 300 to the FPGA 101, the FPGA 101 transfers the dormant data 230 into the configuration position beginning at address zero (see FIG. 3A). This process is performed in the following manner:

(1) The FPGA 101 drives the configuration data bus 103a using general purpose I/O pins 116, 117, 118, 119 to clear or over write (with null data) the configuration data 210 located at address 0x000 to 0xEOF.

(2) The FPGA 101 drives the configuration data bus 103a using general purpose I/O pins 116, 117, 118, 119 to read the dormant data 230 (from 0xEOF+x+1 to 0xEOF2) and write the dormant data 230 to the memory location beginning at address 0x000. It is contemplated the End of File location (0xEOF) may be different due to the implementation of data compression algorithms.

(3) Depending on the specific application, the FPGA 101 may erase or overwrite the Dormant Data 230 in the original memory location (for example, with null data 220 as shown in FIG. 3A).

(4) Using GPIO pin 120 the FPGA 101 asserts the reconfigure command to the configuration assist circuitry 106 via conductor 109.

(5) The configuration assist circuitry 106 asserts nConfig pin 115 via conductor 107 (that is, nConfig pin 115 is pulled low) for the appropriate length of time to force the FPGA 101 into configuration operation.

(6) The FPGA 101 performs the Configuration Operation by using the configuration data bus 103 to read the Dormant Data 220 now starting at address 0x000 from the PROM 102.

In accordance with the first embodiment of the present invention, the PROM 102 may preferably contain numerous dormant data sets 230*a-h* (see FIG. 4). The dormant data sets 230*a-h* allow the FPGA 101 numerous reconfiguration options. Circuitry may exist in the FPGA 101 that allows certain control inputs to determine which dormant data set is transferred to the configuration position. Alternately, each dormant data set may determine which dormant data will be next transferred into the configuration position.

It is contemplated that it is not necessary that the configuration data and dormant data sets be separated by null data. In practical application, the last bit of one data set can be followed by the first bit of the next data set. A preferred embodiment does use null data as separation between the data sets. This is an advantage because in development one can read in the data and "see" the null data pattern. As a result, they will be able to confirm where valid data begins and ends. In addition, there is also a date integrity advantage; a process can be designed to check for the null data pattern and that process used to confirm the end of the configuration data. Since the configuration data can be differing lengths (based on compression variables) it may be advantageous to be able to confirm the end of data in some applications. Further, there is a technicality in working with Flash devices and EEPROMs. Often, to erase these devices you must erase in blocks or sectors of various sizes. As an example, the M25P32 for ST Micro is a 32 Mbit device with the ability to erase 512 Kbit pages. That is, there are 64 sectors that can be individually erased. It is practical to separate the configuration data files, whether the main configuration, or dormant files, so that only one file is erased from memory at a time. Because compressed files may be of different lengths, placing all of the configuration data within a boundary of known limits allows the system to guarantee that at least all of the required data has been moved (transferred). Moving extra data is not a problem, not moving enough data is a problem because the FPGA will not complete the configuration cycle if data is not left out. There is an advantage to placing files with no null data in between. In some applications, packing the data as close as possible allows you to fit more data into a configuration memory device.

It is contemplated in accordance with the first embodiment employing multiple dormant data sets, and with reference to FIG. 4, that the present FPGA system 100 can be implemented in which the FPGA 101 moves dormant data A 230*a* to the configuration position when a first tamper event is indicated by the tamper detection system 310 via the tamper indication signal 300. Following the transfer of dormant data A 230*a* to the configuration position, the FPGA 101 configures itself. Part of this new configuration information is instructions on which dormant data set will be transferred next. When the next tamper event occurs, the FPGA 101 transfers dormant data B 230*b* to the configuration position. This process can continue the same number of times as the number of dormant data sets.

Referring to FIG. 4, a self-modifying FPGA system 100 is also disclosed that includes 2 (or more) dormant data sets; dormant data A 230*a* and dormant data B 230*b* (and others as shown). When a tamper event is indicated by the tamper detection system 310 via the tamper indication signal 300 the FGPA 101 transfers dormant data A 230*a* into the configuration position and reconfigures as described in the preceding sections except that dormant data A 230*a* is not erased from its original location. After the configuration operation is complete, the FPGA configuration based on dormant data A 230*a* transfers dormant data B 230*b* to the configuration position without erasing the original dormant data B 230*b* from the dormant location. At this point, transferring the dormant data set may be automatic or may wait for a tamper indication input. Once dormant data B 230*b* has been transferred to the configuration position, the FPGA 101 outputs the configuration command (via conductor 109) to force the next configuration operation cycle. When the FPGA 101 commences operation with the configuration dictated by dormant data B 230*b*, the process of transferring dormant data A 230*a* into the configuration position begins again (either automatically or in response to an input).

This technique causes the FPGA 101 to eliminate the original FPGA configuration (and the primary functionality of the device) and to continuously cycle between two secondary configurations. This continuous cycling ensures that no residual data remains and adds a great deal of confusion to any effort to reverse engineer the system. If power is removed from the system, when power is reapplied to the system, the FPGA 101 will continuously cycle between the two configurations provided by dormant data A 230*a* and dormant data B 230*b* based either on automatic command or input, which ever was implemented in the FPGA designs represented in the dormant data configuration files. This system can be implemented with any number of dormant data sets limited only by the memory size of the configuration memory device 102.

It is contemplated the present self-modifying FPGA system 100 may be used in a variety of environments. In particular, the present self-modifying FPGA system 100, and underlying techniques, may be used to remotely change the operating characteristics (or features) of a product. Because the new functionality of the FPGA 101 is based on which dormant data set 230, 230*a-h* is transferred to the configuration position, the FPGA 101 can be directed to transfer a specific dormant data set 230, 230*a-h* based on specific requirements. The identification of the appropriate dormant data set 230, 230*a-h* is simply its address in configuration memory.

A system may be designed with a number of dormant data sets in the configuration memory device, each capable of configuring the FPGA with the ability to transfer dormant data and interface to the configuration assist circuitry. This multiple dormant data system is depicted in FIG. 4. Information can be passed to the FPGA 101 concerning which configuration is required next (based on the need for the specific features of the FPGA 101 when configured by that dormant data set). The FPGA 101 can then transfer the proper dormant data set 230*a-h* into the configuration position in configuration memory device 102 and invoke a configuration operation by asserting the reconfigure command to the configuration assist circuitry 106. By so doing, the FPGA 101 will reconfigure itself to handle the selected task.

It should be understood the PROM 102 in FIG. 4 contains many dormant data sets 230*a-h*. As example, some of the data sets are separated by Null Data, and some are not.

In accordance with a second embodiment as disclosed with reference to FIGS. 5 to 12, a method and system for the provision of a self modifying FPGA 1101 for anti-tamper applications is provided wherein the FPGA system 1100 utilizes a non-volatile PROM 1102 for storing multiple sets of FPGA configuration data and an SRAM 1103 for volatile storage of FPGA configuration data. As will be appreciated based upon the following disclosure, the FPGA 1101 of the second embodiment is capable of configuring from either the PROM 1102 or the SRAM 1103. The FPGA system 1100 further includes external configuration assist circuitry 1104, if necessary, to support the FPGA 1101 booting from either PROM 1102 or SRAM 1103.

The second embodiment of the FPGA system 1100 is able to self-modify and self-reconfigure one or more dormant configurations autonomously, does not require intervention, instruction, and/or support from any additional sources, and provides a mechanism to better protect intellectual property contained within the dormant configuration data. The mechanism to better protect intellectual property contained within the dormant configuration data is achieved by initially booting the FPGA 1101 with non-critical (SAFE) configuration data, wherein the SAFE configuration data verifies environmental conditions, passwords, power reserves, etc. When determined appropriate by user-logic in the SAFE configuration, the dormant configuration data is transferred to SRAM 1103 by the PROM 1102 and the FPGA 1101 is reconfigured from dormant configuration data maintained in the SRAM 1103. That is, the SAFE configuration data is used in situations where the user is uncertain as to whether the configuration data must be protected and the dormant configuration data (or dormant data) is used only in the condition of a tested-safe environment. In other words, for SRAM-based self modification in accordance with this embodiment, the SAFE configuration data and the dormant configuration data are not used to trick the user that NO modification has taken place (though that is a useful side-effect), but rather to keep hidden the true, secondary, and/or secret functionality of the device accessible only where the dormant configuration data is utilized.

In particular, when power is applied to the FPGA system 1100, the FPGA 1101 evaluates the voltages present on particular signals input to the FPGA 1101 to determine the desired boot mode. In accordance with a preferred embodiment, and as discussed below, this is accomplished using a configuration assist circuitry 1104. The boot mode inputs to an FPGA 1101 indicate to the FPGA 1101 how, and which, configuration data will be loaded into the FPGA 1101. Each boot mode causes the FPGA 1101 to activate particular internal circuitry necessary to load the configuration data into the FPGA 1101 in the manner indicated by the voltage levels present on the boot mode input pins.

The configuration data loaded into the FPGA 1101 comes from an external device, in particular, either the PROM 1102 or SRAM 1103 in accordance with the second embodiment. The configuration data is also commonly known as the configuration bitstream. It is appreciated that some currently available FPGA boot modes operate automatically (sometimes called "active" boot modes) and generate all of the proper output control signals necessary to load configuration data into itself from the configuration data storage device (such as a PROM). Other currently available FPGA boot modes (sometimes called "passive" boot modes) require external circuitry to generate some or all of the proper output control signals necessary to load configuration data into the FPGA from the configuration data storage device (such as an SRAM, some PROMs, or other mechanisms).

In accordance with the second embodiment disclosed herein an external circuitry 1104 is used to facilitate the chosen boot modes. This external circuitry is referred to herein as the configuration assist circuitry 1104, and may include any number of external components such as counters, timers, microprocessors, other PLDs (Programmable Logic Devices), or other devices and/or circuitry. The disclosed second embodiment assumes the configuration assist circuitry 1104 is designed to default back to assist in a PROM-based FPGA configuration upon system reset. A system reset may come from removal of power, or assertion of a system reset signal or a signal indicating a particular event such as tampering. The configuration assist circuitry 1104 is designed to properly handle each desired boot mode through each step of the self modification process. Those skilled in the art of electronic design will consider the design of configuration assist circuitry for such functionality to be common and well understood.

The configuration assist circuitry 1104 is designed to default back to loading the PROM-based SAFE configuration data 1601 upon system start-up or system reset which may occur due to removal and reapplication of power or any other situation accounted for in the design of the circuitry. The configuration assist circuitry 1104 must be designed properly to keep track of the upcoming configuration mode as well as default to a SAFE configuration mode when appropriate. Such design techniques are common and easily understood to someone skilled in the art of circuit design and need not be discussed in any further detail.

Many modern FPGAs also contain internal circuitry to allow and enable the incoming configuration data to be stored in an encrypted state and be decrypted as it enters the FPGA 1101 during configuration/boot. The exclusion of such FPGA encryption/decryption functionality from the preferred embodiments does not limit the scope of the present invention but only seeks to simplify its explanation.

Once the PROM-based SAFE configuration data, or other configuration data, has been loaded into the FPGA 1101, a transition occurs whereby the internal circuitry previously used for loading configuration data into the FPGA 1101 relinquishes control to the circuitry described by the configuration data loaded into the FPGA 1101. This transition is commonly referred to as the transition from "boot mode" into "user mode." User mode is the common term used by many FPGA device makers to indicate an operational state of the FPGA 1101 whereby the logic structures within the FPGA 1101 operate as described by the configuration data currently loaded into the FPGA 1101.

In accordance with the first embodiment described above with reference to FIGS. 1 to 4, the self modification is achieved by rewriting a PROM 1102 to rewrite the boot area of the configuration device with a previously-dormant version of the configuration data for the purposes of hiding what was previously the normal or SAFE configuration. In accordance with the second embodiment described with reference to FIGS. 5 to 12, that is, SRAM-based self-modification, the normal PROM SAFE configuration data is in fact the "non-secret" configuration, and the dormant files making up the dormant configuration data are additional configurations including those that must remain protected. So in a condition of tamper, the FPGA may quickly reconfigure from the PROM's normal SAFE configuration data and erase whatever was previously in the SRAM 1103. Only in the condition of a tested-safe environment will the additional or secret configuration bitstreams, that is, the dormant configuration data, ever be loaded. In other words, for SRAM-based self modification in accordance with this embodiment a tamper event is not to trick the user that NO modification has taken place (though that is a useful side-effect), but rather to keep hidden the true, secondary, and/or secret functionality of the device. It is anticipated that dormant configuration data may be stored elsewhere within the FPGA system 1100 so long as all of the necessary logic and circuitry exist to properly transfer the dormant configuration data to the SRAM 1103 and/or PROM 1102 in such a way that the FPGA 1101 can ultimately load it as configuration data.

Although the preferred embodiment utilizes an FPGA 1101, a PROM 1102, and an SRAM 1103, it is appreciated that the underlying concepts of the present invention may be applied not only to FPGAs but also to microprocessors and other devices. The present invention does not base itself on the specific technology of FPGAs on which it was first implemented but rather on the methods and techniques to give an electronic system the ability to give itself new functionality.

Referring now to FIG. 5, the contents (or memory map) of an exemplary PROM 1102 (programmable read only memory) in accordance with a preferred embodiment are shown indicating that at memory location "0x0000" (address location zero, as written in common hexadecimal notation) there exists FPGA SAFE configuration data 1601. Additional sets of configuration data (1603, 1605, 1607, 1608, 1610, 1611, 1612, and 1614), that is, the dormant configuration data mentioned above, are stored elsewhere within the PROM 1102 and are labeled "Dormant Data" because the FPGA 1101 might not natively know where or in what format the dormant configuration data 1603, 1605, 1607, 1608, 1610, 1611, 1612, 1614 is stored. Within the second embodiment, the configuration data 1601 is considered the "SAFE" configuration data because it contains no critical technology or information, but does contain the information necessary to determine whether or not the operating environment is appropriate to allow the next step of self modification. The SAFE configuration data 1601 also includes the necessary functionality to read dormant configuration data 1603, 1605, 1607, 1608, 1610, 1611, 1612, 1614 from the PROM 1102 and write it to the SRAM 1103 from which the FPGA 1101 can later reconfigure. There may be one or more dormant configuration data files located within the PROM 1102 along with the SAFE configuration data 1601.

It is appreciated there is no requirement that the dormant configuration data 1603, 1605, 1607, 1608, 1610, 1611, 1612, 1614 be located within the PROM 1102 itself, but may be stored at other locations within the FPGA system 1100. The second embodiment places the dormant configuration data 1603, 1605, 1607, 1608, 1610, 1611, 1612, 1614 in the same PROM 1102 as the SAFE configuration data 1601 to simplify the explanation of the invention. Systems employing other storage locations and/or mechanisms for dormant data are anticipated. The dormant configuration data may be located anywhere and in any format, so long as each stage of configuration throughout the self modification technique includes sufficient capability to properly prepare the desired dormant configuration data set for the next step in the self modification reconfiguration cycle.

FIG. 6 shows a wiring diagram for the second embodiment of the FPGA system 1100 employing the present self-modification technique using a PROM 1102 and a SRAM 1103. The FPGA 1101 is connected to the PROM 1102 and SRAM 1103 as well as any additional necessary circuitry (for example, "Configuration Assist Circuitry" 1104) through both its built-in configuration pins 1201, 1202, 1203, 1204, 1205 of the configuration block 501 as well as other general purpose pins 1220, 1230, 1231, 1232, 1233, 1234 of the user-mode input/output 502 that will be used in user-mode to perform additional steps required in the self modification technique. The configuration assist circuitry 1104 may be devices, circuits, and/or logic functionality contained within or external to the FPGA 1101. It is appreciated that some FPGAs allow one or more pins to be used for a particular purpose during the loading of configuration data into the FPGA ("boot mode") and those same pins to be used for other user-defined purposes after configuration data loading is complete ("user mode"). In those situations some of the configuration pins 1201, 1202, 1203, 1204, 1205 and some of the general purpose pins 1220, 1230, 1231, 1232, 1233, 1234 may share the same physical pin on the FPGA, yet function differently based upon the current operating mode of the FPGA.

As shown with reference to FIG. 6 there are multiple paths whereby FPGA configuration data may be loaded into the FPGA 1101, particularly from the PROM 1102 (via Data0 1401) and SRAM 1103 (via Data0-Data 7 1402). The use of chip enable pins on the PROM 1102 and SRAM 1103 ensure that only one device is driving the FPGA configuration inputs at any given time. The FPGA 1101 and/or the configuration assist circuitry 1104 generate these chip enable control signals 1301, 1302 through each phase of the self modification technique.

The overall connection diagram is shown in FIG. 6 at a functional level. For example, power and ground connections are not shown, nor are shown other connections that do not apply to the technique presented. It is understood that even the preferred embodiment may be accomplished using a number of different combinations of logic gates (and, or, nor, multiplexors, etc.), of which particular implementations are unimportant to the overall methods and techniques of the present invention.

FIG. 7 shows the first phase of self modification in accordance with the present invention whereby SAFE configuration data 1601 is initially loaded from the PROM 1102 into the FPGA 1101. The FPGA 1101 and/or any supporting configuration assist circuitry 1104 applies the proper chip enable signals (1301, 1302) to disable the SRAM 1103 and enable the PROM 1102 to communicate SAFE configuration data 1601 to the FPGA 1101. In this example the synchronizing clock (DCLK 1201) comes from the FPGA 1101, while further communication is achieved by the interaction between the configuration assist circuitry 1104 and the configuration pin 1204 and the boot mode pin 1205 of the control block 501 of the FPGA 1101. The SAFE configuration data 1601 that is loaded into the FPGA 1101 via Data0 input 1401 contains all required functionality to perform the next stages of self modification, while instruction from the FPGA 1101 to the PROM 1202 are provided via the ADSI 1203. This includes any communication to circuitry external to the FPGA 1101 (such as configuration assist circuitry 1104) that helps provide additional functionality necessary for self modification.

One functional task of the user logic described by the SAFE configuration data 1601 is to properly sanitize the contents of the SRAM 1103 to protect the situation that this SAFE configuration data boot cycle was the result of unexpected removal and reapplication of power to the FPGA system 1100. As is appreciated, sanitizing removes from the SRAM 1103 any trace of configuration data that was loaded into the FPGA 1101. Care must be taken to ensure that other user-mode logic that is operating at the same time does not store data in the SRAM 1103 in any location that will be sanitized, unless sanitization of that data is desired. Another task of the SAFE configuration data 1601 is to properly determine whether or not the FPGA system 1100 can proceed with the next phase of self modification. This determination may include sufficient verification of passwords, power reserves, or any number of other environmental conditions. It is appreciated neither of these tasks are required for self modification in accordance with the present invention, but both tasks are considered beneficial and are therefore recommended.

The SAFE configuration data 1601 must include user mode logic functionality to read data from the PROM 1102 and write data to the SRAM 1103 appropriately to transfer dormant configuration data (1603, 1605, 1607, 1608, 1610, 1611, 1612, or 1614) contained within the PROM 1102 to the SRAM 1103 in such a way that the FPGA 1101 can reconfigure based upon the loaded dormant configuration data.

FIG. 8 shows the process of moving dormant configuration data (1603, 1605, 1607, 1608, 1610, 1611, 1612, or 1614) from the PROM 1102 to the SRAM 1103. Once the decision has been made to transfer dormant configuration data (1603, 1605, 1607, 1608, 1610, 1611, 1612, or 1614) from the PROM 1102 to the SRAM 1103, that is, once it has been determined a tested-safe environment exists, user logic contained with the SAFE configuration data 1601 currently operating within the FPGA 1101 extracts the desired dormant configuration data (1603, 1605, 1607, 1608, 1610, 1611, 1612, or 1614) from the PROM 1102 and loads it into the SRAM 1103 in the appropriate way so that the FPGA 1101 can later load configuration data from the SRAM 1103 into the FPGA 1101. This is achieved by actively addressing both the PROM 1102 and SRAM 1103 with SRAM Address/Data pin 1230, SRAM Chip Select pin 1231, ADSI pin 1232, PROM Chip Select pin 1233 and DCLK pin 1234, and ultimately ensuring the passage of data from the PROM 1102 to the user-mode input/output 502 via Data0 1401 and to the SRAM 1103 via SRAM Address/Data 1230. The user-mode logic operating within the FPGA 1101 and any necessary external configuration assist circuitry 1104 generate all necessary signals to read from the PROM 1102 and write to the SRAM 1103.

When the dormant configuration data (1603, 1605, 1607, 1608, 1610, 1611, 1612, or 1614) has been completely and properly moved to the SRAM 1103, any external configuration assist circuitry 1104 is instructed to switch the voltages applied to the FPGA BootMode input pins 1205 (via BootSelect pin 1220 of the user mode input/output 502 of the FPGA) to instruct the FPGA 1101 to now boot from SRAM 1103 instead of from PROM 1102. Reconfiguration of the FPGA 1101 is then initiated by the user-mode logic currently operating within the FPGA 1101, instructing any external configuration assist circuitry 1104 to support the reconfiguration process as necessary.

FIG. 9 shows the process of configuring the FPGA 1101 from the SRAM 1103 whereby dormant configuration data (1603, 1605, 1607, 1608, 1610, 1611, 1612, or 1614) is now stored as the primary configuration file within the SRAM 1103. The configuration data stored in the SRAM 1103 is also called the SECURE configuration data. The FPGA 1101 and/ or any supporting configuration assist circuitry 1104 applies the proper chip enable signals (1301, 1302) to disable the PROM 1102 and enable the SRAM 1103 to communicate configuration data to the FPGA 1101 via Data0-Data7 1402. In this example the synchronizing clock pox 1201) comes from the FPGA 1101 and the required SRAM address circuitry 1303 comes from the configuration assist circuitry 1104.

The SECURE configuration data that loads into the FPGA 1101 through this process contains all required functionality to perform the next stages of self modification. This includes any communication to circuitry external the FPGA (such as configuration assist circuitry 1104) that helps provide additional functionality necessary for self modification. If an additional stage of self modification is desired, then the SECURE configuration data loaded into the FPGA 1101 must also include functionality to read data from the PROM 1102 and write data to the SRAM 1103 appropriately to transfer any additional dormant configuration file (1603, 1605, 1607, 1608, 1610, 1611, 1612, or 1614) contained within the PROM 1102 to the SRAM 1103 in such a way that the FPGA 1101 can reconfigure based upon the newly copied dormant data. The user mode logic functionality described by the loaded SECURE configuration data may need to communicate to the external configuration assist circuitry 1104 to reset the next boot sequence back to PROM 1102 in case of system reset. Alternatively the configuration assist circuitry 1104 may be designed to switch back to PROM-based configuration automatically. Yet another option is that the user-mode logic may determine that an additional self modification stage is necessary. If the user-mode logic described by the SECURE configuration data loaded into the FPGA 1101 determines that an additional self modification stage is necessary, then the processes described previously repeat, including copying a dormant configuration data (1603, 1605, 1607, 1608, 1610, 1611, 1612, or 1614) from the PROM 1102 and writing it appropriately to the SRAM 1103 and notifying the external configuration assist circuitry 1104 as necessary to ensure the next configuration will again utilize SRAM 1103 based configuration. Another task of the SECURE configuration data is to properly sanitize the contents of the SRAM 1103 to protect the situation of removal of power to the FPGA system 1100 to keep secure the contents of the SRAM 1103 during reconfiguration. Another task of the SECURE configuration data is to properly decide whether or not the FPGA system 1100 can proceed with the next phase of self modification, if any. This task may include sufficient verification of passwords, power reserves, or any number of other environmental conditions. It is appreciated neither of these tasks are required for self modification in accordance with the present invention, but both task are considered beneficial and are therefore recommended.

With reference to FIGS. 6-12, the fundamental sequence of events for self modifying logic using an intermediate volatile SRAM 1103 is as follows. During manufacturing, refurbishment, repair, and/or at other times, the configuration PROM 1102 is programmed with both SAFE configuration data 1601 as well as dormant, secure configuration data (1603, 1605, 1607, 1608, 1610, 1611, 1612, or 1614). The SAFE configuration data 1601 will be loaded during initial application of power to the FPGA system 1100, so this SAFE configuration data must at a minimum include the user-mode logic functionality necessary to perform the task of self modification. During this step, the SRAM contents do not matter for self modification functionality.

Upon application of power to the FPGA system 1100, the configuration assist circuitry 1104 defaults to the initial configuration state whereby it sends a signal to any necessary data multiplexors, chip select ENABLES, address generators, or other circuitry to allow the PROM data to pass to the FPGA configuration pins, as well as indicating to the FPGA 1101 the desired configuration mode necessary for PROM 1102 configuration to occur. This can be any configuration mode that the FPGA 1101 supports, so long as sufficient configuration assist circuitry 1104 exists to facilitate proper configuration. During this step, the default, SAFE configuration data 1601 located at the default, standard configuration device address is loaded into the FPGA 1101. Typically this SAFE configuration data 1601 puts the FPGA 1101 into a safe mode ready to take the next step of self modification.

Once configured into the standard safe operating mode, one of the first tasks is to sanitize some or all the SRAM 1103, in case the application of power was the result of loss of power after previously operating in a secured state. After SRAM sanitization is complete, the FPGA 1101 then makes a determination whether or not to proceed to the next step of self modification; that is, determining whether a tested-safe environment exists that permits use of the dormant configuration data. Determination may include authorization of the system, its environment, proper passwords, or any number of desired decisions (if any) prior to proceeding to the next step of self modification, that is, the loading of the dorman configuration data in the FPGA 1101.

Once cleared for self modification, the FPGA 1101 will enable user-mode logic functionality (contained within the safe configuration previously loaded) to take control of both the PROM 1102 and the SRAM 1103 using sufficient circuitry to read from the PROM 1102 and write to the SRAM 1103. The self modification user-mode logic functionality begins to access the PROM 1102 in the appropriate fashion to extract the secure configuration data, that is, the desired dormant configuration data, and also begins to access the SRAM 1103 in the appropriate fashion to load the secure configuration data. These processes may include linear and/or non-linear access to the PROM 1102 and/or SRAM 1103, as well as any necessary decryption processes to ensure the desired dormant configuration data (1603, 1605, 1607, 1608, 1610, 1611, 1612, or 1614) contained in the PROM 1102 is loaded into the SRAM 1103 in such a way that the FPGA 1101 can properly initialize after loading the new configuration data from the SRAM 1103. Data loaded into the SRAM 1103 may be encrypted data, to be decrypted by the FPGA's bitstream decryption circuitry.

Once the desired dormant configuration data (1603, 1605, 1607, 1608, 1610, 1611, 1612, or 1614) is properly loaded into the SRAM 1103, the user-mode FPGA logic indicates to the configuration assist circuitry 1104 to set the configuration mode to the FPGA 1101 as necessary for booting from SRAM 1103, including setting up any necessary data multiplexors, chip select enables, address generators, or other circuitry, and the configuration assist circuitry 1104 initiates reconfiguration and controls the required signals.

Once reconfiguration is initiated, the FPGA 1101 loads the desired dormant configuration data 1601 from the SRAM 1103 into the FPGA 1101. Then, one of the first tasks is to reset the configuration assist circuitry 1104 to switch back to safe-mode PROM booting in the event of system shutdown or power cycling. Alternatively, the resetting of the configuration assist circuitry 1104 could be automatic as a part of the circuitry design. After resetting the boot mode to PROM 1102, the user-mode logic may then sanitize some or all of the SRAM 1103 to remove from SRAM 1103 any trace of configuration data that was loaded into the FPGA 1101. Care must be taken to ensure that other user-mode logic that is operating at the same time does not store data in the SRAM 1103 in any location that will be sanitized unless sanitization of that data is desirable. A simple "DONE" flag from the self modification logic would be a sufficient way to indicate when the SRAM sanitization is complete.

After SRAM sanitization, the decision must then be made whether or not to proceed to the next phase of secure configuration from additional dormant configuration data. If so, the necessary steps detailed above are repeated to make the appropriate decisions and take the appropriate actions to perform another dormant configuration data load into SRAM 1103 and to initiate reconfiguration yet again from the SRAM device.

It should be appreciated each reconfiguration stage must ensure that data is located properly in the SRAM 1103 before switching to configure from the SRAM device, as well as switching to configure back to the SAFE configuration data located within the PROM 1102 before sanitizing the SRAM 1103. These order-specific precautions ensure that if reconfiguration is interrupted, a mechanism to revert back to the original safe configuration located in the standard PROM configuration address is initiated.

While the preferred embodiments have been shown and described, it will be understood that there is no intent to limit the invention by such disclosure, but rather, is intended to cover all modifications and alternate constructions falling within the spirit and scope of the invention.

The invention claimed is:

1. A self-modifying FPGA system, comprising:
an FPGA;
a configuration memory coupled to the FPGA for providing the FPGA with configuration data including SAFE configuration data and dormant configuration data, the configuration memory including a PROM and SRAM;
wherein the SAFE configuration data is initially loaded to the FPGA and the FPGA is configured to a safe operating mode, and upon a determination to proceed to a next step of self modification, dormant configuration data contained in the configuration memory is loaded into the FPGA and the FPGA is configured to a secure operating mode; and
wherein the SAFE configuration data includes user mode logic functionality to read data from the PROM and write data to the SRAM appropriately to transfer dormant configuration data contained within the PROM to the SRAM.

2. The self-modifying FPGA system according to claim 1, wherein the PROM stores the SAFE configuration data and the dormant configuration data.

3. The self-modifying FPGA system according to claim 1, wherein the SRAM provides for the volatile storage of the dormant configuration data.

4. The self-modifying FPGA system according to claim 1, wherein the FPGA is capable of receiving configuration data from either the PROM or the SRAM.

5. The self-modifying FPGA system according to claim 1, further including configuration assist circuitry coupled to the FPGA, the PROM and the SRAM for controlling loading of configuration information from the PROM and the SRAM to the FPGA.

6. The self-modifying FPGA system according to claim 1, wherein the SAFE configuration data functions to sanitize the contents of the SRAM.

7. The self-modifying FPGA system according to claim 1, further including configuration assist circuitry coupled to the FPGA and the configuration memory device for controlling loading of configuration information from the configuration memory device to the FPGA.

* * * * *